United States Patent
Ishizaki et al.

(10) Patent No.: US 10,170,494 B2
(45) Date of Patent: Jan. 1, 2019

(54) SEMICONDUCTOR DEVICE AND METHOD FOR MANUFACTURING THE SAME

(71) Applicant: Toshiba Memory Corporation, Tokyo (JP)

(72) Inventors: Takeshi Ishizaki, Aichi (JP); Atsuko Sakata, Mie (JP); Satoshi Wakatsuki, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 30 days.

(21) Appl. No.: 15/048,120

(22) Filed: Feb. 19, 2016

(65) Prior Publication Data

US 2017/0062466 A1    Mar. 2, 2017

(30) Foreign Application Priority Data

Aug. 25, 2015    (JP) .................................. 2015-165586

(51) Int. Cl.
*H01L 27/11*    (2006.01)
*H01L 27/11582*    (2017.01)
*H01L 49/02*    (2006.01)

(52) U.S. Cl.
CPC ........ *H01L 27/11582* (2013.01); *H01L 28/00* (2013.01)

(58) Field of Classification Search
CPC ..................... H01L 27/11582; H01L 27/11568
See application file for complete search history.

(56) References Cited

U.S. PATENT DOCUMENTS

| | | | |
|---|---|---|---|
| 5,709,958 A | 1/1998 | Toyoda et al. | |
| 6,054,770 A | 4/2000 | Toyoda et al. | |
| 8,168,539 B2 | 5/2012 | Sugiura et al. | |
| 8,922,018 B2 | 12/2014 | Ishizaki et al. | |
| 2008/0157080 A1* | 7/2008 | Gruner .................. | B82Y 10/00 257/59 |
| 2009/0246373 A1 | 10/2009 | Tachibana et al. | |
| 2011/0049646 A1* | 3/2011 | Lim .................. | H01L 21/28556 257/410 |
| 2011/0101438 A1* | 5/2011 | Yoo ..................... | G11C 16/0416 257/316 |
| 2012/0094453 A1* | 4/2012 | Han .................. | H01L 27/11582 438/269 |
| 2012/0306081 A1 | 12/2012 | Ishizaki et al. | |

FOREIGN PATENT DOCUMENTS

| | | |
|---|---|---|
| JP | 10-64907 | 3/1998 |
| JP | 2002-367999 | 12/2002 |

* cited by examiner

*Primary Examiner* — Fernando L Toledo
*Assistant Examiner* — Neil Prasad
(74) *Attorney, Agent, or Firm* — Finnegan, Henderson, Farabow, Garrett & Dunner, L.L.P.

(57) ABSTRACT

According to one embodiment, a semiconductor device includes an underlying metal film and a metal film. The underlying metal film is a tantalum-aluminum film having an aluminum content of more than 50 atomic % and less than 85 atomic %, a tungsten-zirconium film having a zirconium content of less than 40 atomic %, a tungsten-titanium film having a titanium content of less than 80 atomic %, or a tungsten film. The metal film is provided on the underlying metal film and in contact with the underlying metal film. The metal film contains at least one of tungsten and molybdenum, and has a main orientation of (100) or (111).

17 Claims, 9 Drawing Sheets

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2015-165586, filed on Aug. 25, 2015; the entire contents of which are incorporated herein by reference.

FIELD

Embodiments described herein relate generally to a semiconductor device and a method for manufacturing the same.

BACKGROUND

A gate electrode of a memory device and an interconnect of a cross-point memory require high melting point and low resistance. For such an electrode (interconnect) material, tungsten or molybdenum is under investigation. However, they have higher bulk resistivity than e.g. copper, which is typically used for low-resistance interconnect in a semiconductor device.

DETAILED DESCRIPTION

Figure 1:
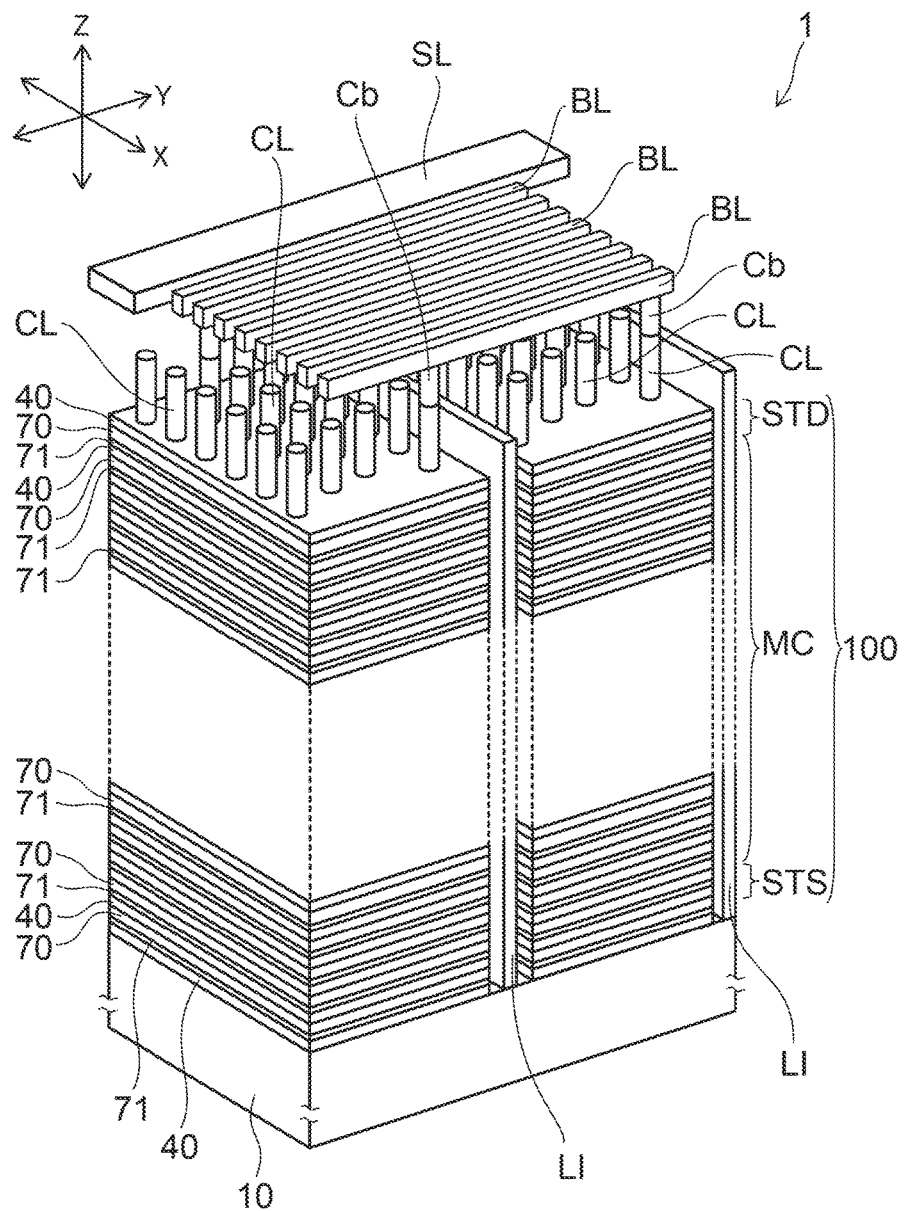
FIG. 1 is a schematic perspective view of a semiconductor device of an embodiment.

According to one embodiment, a semiconductor device includes an underlying metal film and a metal film. The underlying metal film is a tantalum-aluminum film having an aluminum content of more than 50 atomic % and less than 85 atomic %, a tungsten-zirconium film having a zirconium content of less than 40 atomic %, a tungsten-titanium film having a titanium content of less than 80 atomic %, or a tungsten film. The metal film is provided on the underlying metal film and in contact with the underlying metal film. The metal film contains at least one of tungsten and molybdenum, and has a main orientation of (100) or (111).

Embodiment will now be described with reference to the drawings. In the drawings, like elements are labeled with like reference numerals.

The semiconductor device of the embodiments is e.g. a semiconductor memory device including a memory cell array.

FIG. 1 is a schematic perspective view of the memory cell array 1 of the embodiment.

In FIG. 1, two directions parallel to the major surface of the substrate 10 and orthogonal to each other are referred to as X-direction (first direction) and Y-direction (second direction). The direction orthogonal to both the X-direction and the Y-direction is referred to as Z-direction (third direction, stacking direction).

The memory cell array 1 includes a substrate 10, a stacked body 100 provided on the major surface of the substrate 10, a plurality of columnar parts CL, a plurality of conductive members LI, and an upper interconnect provided on the stacked body 100. FIG. 1 shows a bit line BL and a source layer SL as the upper interconnect.

The columnar part CL is formed like a circular column or elliptical column extending in the stacking direction (Z-direction) in the stacked body 100. The conductive member LI extends in the stacking direction (Z-direction) of the stacked body 100 and the X-direction between the upper interconnect and the substrate 10. The conductive member LI separates the stacked body 100 in the Y-direction.

The plurality of columnar parts CL are arranged in e.g. a staggered arrangement. Alternatively, the plurality of columnar parts CL may be arranged in a square lattice along the X-direction and the Y-direction.

A plurality of bit lines (e.g., metal films) BL are provided on the stacked body 100. The plurality of bit lines BL are separated from each other in the X-direction. Each bit line BL extends in the Y-direction.

The upper end part of the columnar part CL is connected to the bit line BL through a contact part Cb. The plurality of columnar parts CL, each of which is selected from each of areas (blocks) separated in the Y-direction by the conductive member LI, are connected to one common bit line BL.

Figure 2:
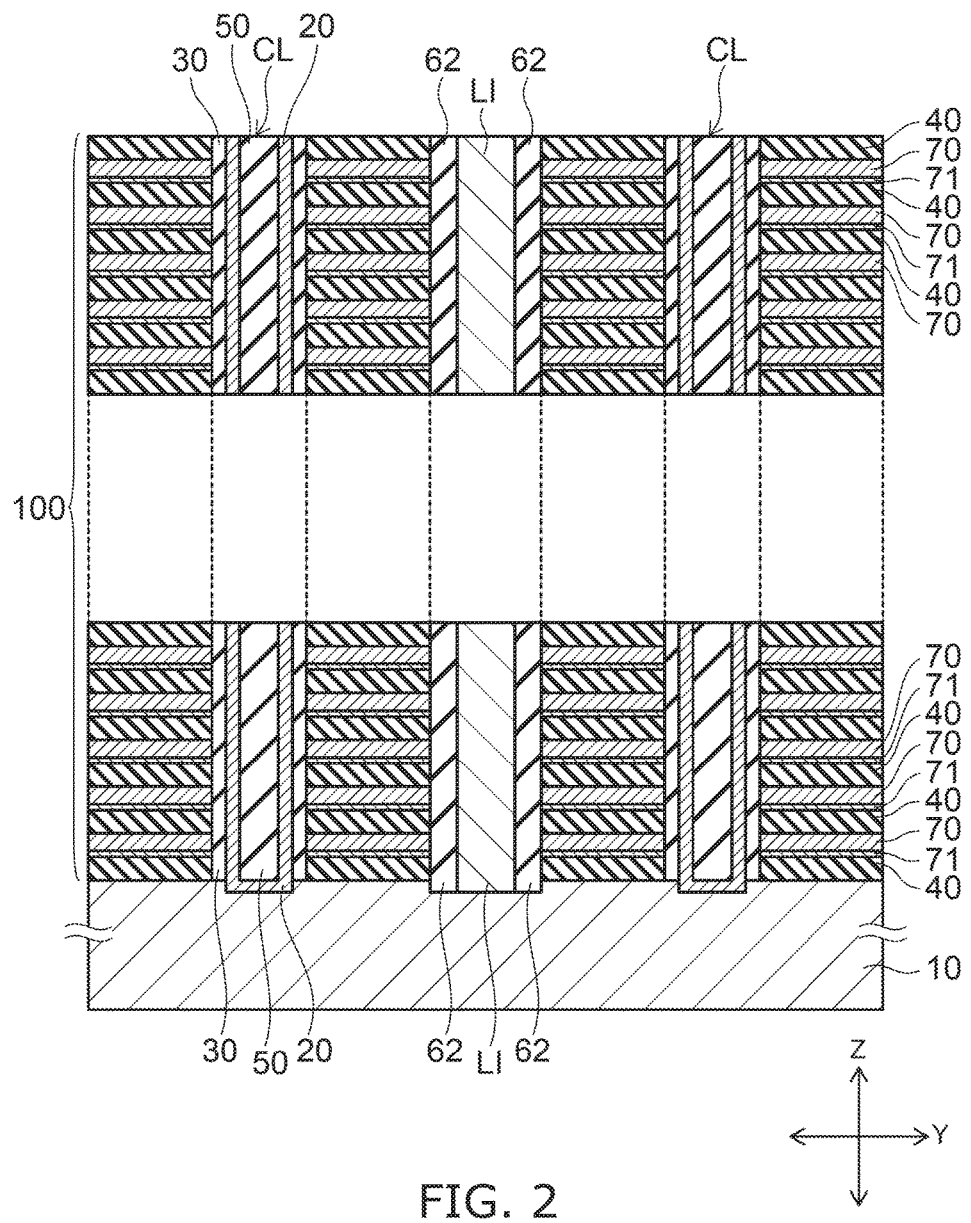
FIG. 2 is a schematic sectional view of the semiconductor device of the embodiment.

FIG. 2 is a schematic sectional view of the substrate 10 and the stacked body 100. FIG. 2 shows a cross section parallel to the Y-Z plane in FIG. 1.

The stacked body 100 includes a plurality of metal films 70, a plurality of insulating films 40, and a plurality of underlying metal films 71. The metal films 70, the insulating films 40, and the underlying metal films 71 are stacked in the direction (Z-direction) perpendicular to the major surface of the substrate 10.

The metal films 70 are stacked in the Z-direction at a prescribed pitch via the insulating film 40. The insulator between the metal films 70 adjacent in the Z-direction is not limited to the insulating film 40, but may be an air gap. In the example shown in FIG. 2, a stacked film of the underlying metal film 71 and the metal film 70 is stacked in a plurality at a prescribed pitch via the insulating film 40.

The underlying metal film 71 is provided between the lower surface of the metal film 70 and the insulating film 40. The underlying metal film 71 is in contact with the lower surface of the metal film 70. The insulating film 40 is provided between the underlying metal film 71 and the upper surface of the metal film 70 located one layer below the underlying metal film 71. The underlying metal film 71 is not provided on the upper surface of the metal film 70. The underlying metal film 71 is provided for each metal film 70. The number of underlying metal films 71 is equal to the number of metal films 70. The plurality of underlying metal films 71 are not connected in the stacking direction of the stacked body 100, but are separated from each other in the stacking direction.

The metal film 70 contains at least one of tungsten (W) and molybdenum (Mo). The metal film 70 is a tungsten film primarily containing tungsten, or a molybdenum film primarily containing molybdenum. The insulating film 40 primarily contains e.g. silicon oxide ($SiO_2$).

The underlying metal film 71 is a tantalum-aluminum film primarily containing tantalum-aluminum (TaAl) alloy. Alternatively, the underlying metal film 71 is a tungsten-zirconium film primarily containing tungsten-zirconium (WZr) alloy. Alternatively, the underlying metal film 71 is a tungsten-titanium film primarily containing tungsten-titanium (WTi) alloy. Alternatively, the underlying metal film 71 is a tungsten film (an element film of tungsten) primarily containing tungsten (W).

The metal film 70 is crystallized. The metal film 70 is thicker than the underlying metal film 71.

The underlying metal film 71 is amorphous. Alternatively, the underlying metal film 71 is a microcrystalline film having an average grain size of the crystal smaller than an average grain size of the crystal of the metal film 70.

Here, an amorphous film has a broad diffraction intensity, or halo peak, observed by diffraction measurement for electron beam diffraction and X-ray diffraction such as RHEED (reflection high energy electron diffraction). It may be observed diffraction lines from intermetallic compound microcrystals due to incomplete amorphousness. Furthermore, the underlying metal film 71 does not need to be entirely amorphous. The underlying metal film 71 may have a structure in which part of the crystalline thin film is made amorphous.

The aluminum (Al) content in the tantalum-aluminum (TaAl) film as the underlying metal film 71 is more than 50 atomic % and less than 85 atomic %. The metal film (Mo film or W film) 70 formed on such a TaAl film has a main orientation of (100). The main orientation of the plane of the metal film 70 along the interface with the underlying metal film (TaAl film) 71 is (100).

The main orientation of (100) means that the diffraction intensity in the plane orientation (100) is the strongest in the diffraction measurement for e.g. the surface of the metal film 70 or the aforementioned interface of the metal film 70.

The zirconium (Zr) content in the tungsten-zirconium (WZr) film as the underlying metal film 71 is less than 40 atomic %. The metal film (Mo film or W film) 70 formed on such a WZr film has a main orientation of (111). The main orientation of the plane of the metal film 70 along the interface with the underlying metal film (WZr film) 71 is (111).

The main orientation of (111) means that the diffraction intensity in the plane orientation (111) is the strongest in the diffraction measurement for e.g. the surface of the metal film 70 or the aforementioned interface of the metal film 70.

The titanium (Ti) content in the tungsten-titanium (WTi) film as the underlying metal film 71 is less than 80 atomic %. The metal film (Mo film or W film) 70 formed on such a WTi film has a main orientation of (111). The main orientation of the plane of the metal film 70 along the interface with the underlying metal film (WTi film) 71 is (111).

The metal film (Mo film or W film) 70 formed on the tungsten (W) film as the underlying metal film 71 has a main orientation of (111). The main orientation of the plane of the metal film 70 along the interface with the underlying metal film (W film) 71 is (111).

As shown in FIG. 2, the columnar part CL includes a memory film 30, a semiconductor film 20, and a core insulating film 50.

The memory film 30 and the semiconductor film 20 extend like a pipe in the stacking direction (Z-direction) in the stacked body 100. The memory film 30 is provided between the stacked body 100 and the semiconductor film 20. The memory film 30 surrounds the semiconductor film 20 from the outer peripheral side. The core insulating film 50 is provided inside the pipe-shaped semiconductor film 20. The upper end part of the semiconductor film 20 is electrically connected to the bit line BL through the contact part Cb shown in FIG. 1.

Figure 3:
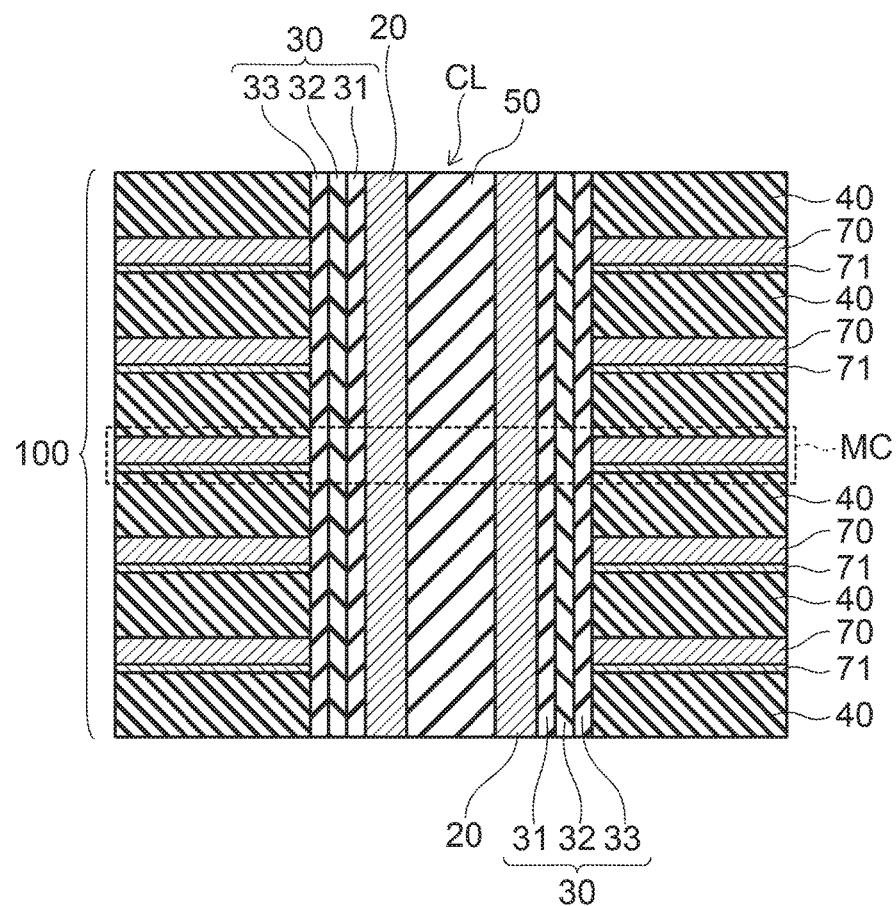
FIG. 3 is a partially enlarged sectional view of FIG. 2.

FIG. 3 is a partially enlarged sectional view of FIG. 2.

The memory film 30 includes a block insulating film 33, a charge storage film 32, and a tunnel insulating film 31. The block insulating film 33, the charge storage film 32, the tunnel insulating film 31, and the semiconductor film 20 extend continuously in the stacking direction of the stacked body 100. The block insulating film 33, the charge storage film 32, and the tunnel insulating film 31 are provided sequentially from the stacked body 100 side between the stacked body 100 and the semiconductor film 20.

The block insulating film 33 is in contact with the metal film 70. The tunnel insulating film 31 is in contact with the semiconductor film 20. The charge storage film 32 is provided between the block insulating film 33 and the tunnel insulating film 31.

The semiconductor film 20, the memory film 30, and the metal film 70 constitute a memory cell MC. The memory cell MC has a vertical transistor structure in which the metal film 70 surrounds the semiconductor film 20 via the memory film 30.

The semiconductor film 20 functions as a channel of the memory cell MC of the vertical transistor structure. The metal film 70 functions as a control gate (control electrode). The charge storage film 32 functions as a data storage layer for storing charge injected from the semiconductor film 20.

The semiconductor memory device of the embodiment is a nonvolatile semiconductor memory device capable of electrically and freely erasing/programming data and retaining its memory content even when powered off.

The memory cell MC is e.g. a charge trap type memory cell. The charge storage film 32 includes a large number of trap sites for trapping charge in the insulating film, and includes e.g. silicon nitride film.

The tunnel insulating film 31 serves as a potential barrier when charge is injected from the semiconductor film 20 into the charge storage film 32, or when the charge stored in the charge storage film 32 is released into the semiconductor film 20. The tunnel insulating film 31 includes e.g. silicon oxide film.

The block insulating film 33 prevents the charge stored in the charge storage film 32 from releasing into the metal film 70. The block insulating film 33 includes a stacked film of e.g. a silicon oxide film and a film having higher dielectric constant (silicon nitride film, aluminum oxide film, hafnium oxide film, or yttrium oxide film) than the silicon oxide film.

As shown in FIG. 1, a drain side select transistor STD is provided in the upper end part of the columnar part CL. A source side select transistor STS is provided in the lower end part of the columnar part CL. At least the lowermost metal film 70 of the plurality of metal films 70 functions as a control gate (control electrode) of the source side select transistor STS. At least the uppermost metal film 70 of the plurality of metal films 70 functions as a control gate (control electrode) of the drain side select transistor STD.

The drain side select transistor STD and the source side select transistor STS are vertical transistors like the memory cell MC. A current flows in the stacking direction (Z-direction) of the stacked body 100.

A plurality of memory cells MC are provided between the drain side select transistor STD and the source side select transistor STS. The memory cells MC, the drain side select transistor STD, and the source side select transistor STS are series connected through the semiconductor film 20 and constitute one memory string. Such memory strings are arranged in e.g. a staggered arrangement in the plane direction parallel to the X-Y plane. Thus, the plurality of memory cells MC are provided three-dimensionally in the X-direction, the Y-direction, and the Z-direction.

As shown in FIG. 2, an insulating film 62 is provided on both sidewalls of the conductive member LI separating the stacked body 100 in the Y-direction. The insulating film 62 is provided between the stacked body 100 and the conductive member LI. In FIG. 1, the insulating film 62 is not shown.

The conductive member LI is a metal member primarily containing e.g. tungsten. The upper end part of the conductive member LI is connected to the source layer SL, shown in FIG. 1, provided on the stacked body 100. The lower end of the conductive member LI is in contact with the substrate 10 as shown in FIG. 2. The lower end of the semiconductor film 20 is in contact with the substrate 10. The substrate 10 is e.g. a silicon substrate doped with impurity and having conductivity. Thus, the lower end of the semiconductor film 20 is electrically connected to the source layer SL through the substrate 10 and the conductive member LI.

Next, a method for manufacturing a semiconductor memory device of the embodiment is described with reference to FIGS. 4 and 5.

Figure 4:
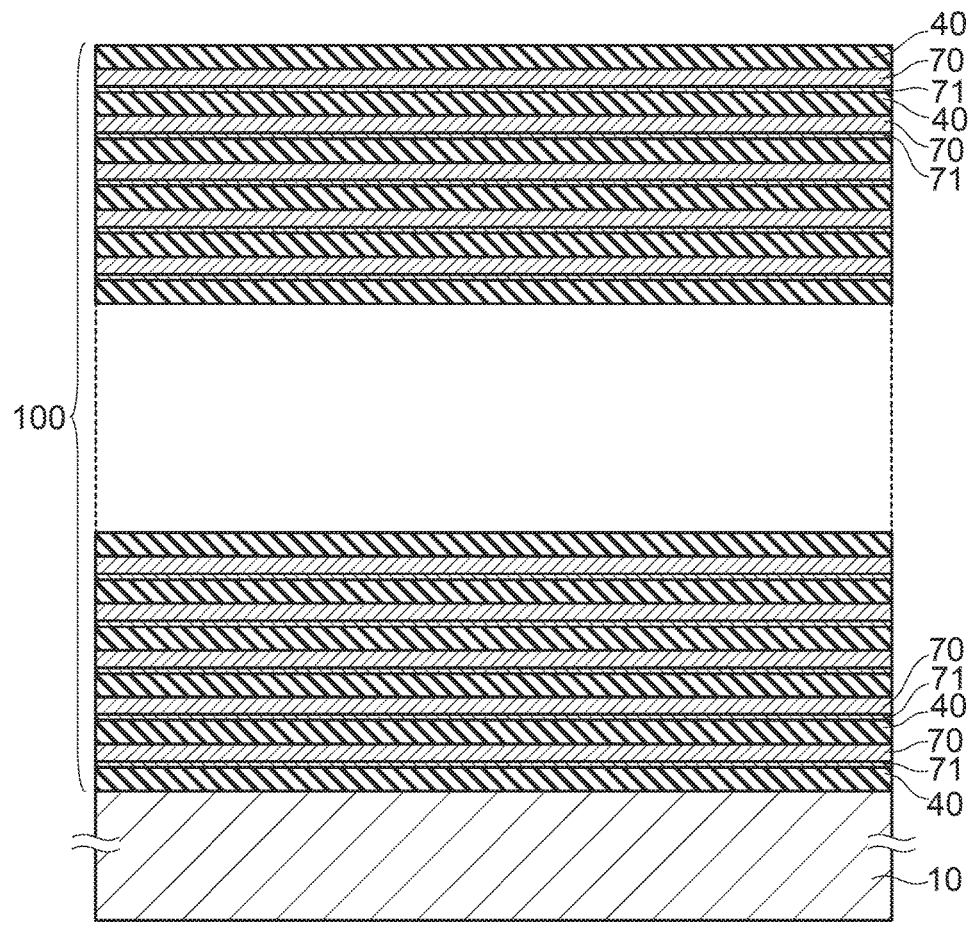
FIG. 4 and FIG. 5 are schematic sectional views showing a method for manufacturing the semiconductor device of the embodiment.

As shown in FIG. 4, a stacked body 100 is formed on a substrate 10. An insulating film 40 is formed on the major surface of the substrate 10. An underlying metal film 71 is formed on the insulating film 40. A metal film 70 is formed on the underlying metal film 71. An insulating film 40 is formed again on the metal film 70. Then, a similar step for forming an underlying metal film 71 on the insulating film 40, forming a metal film 70 on the underlying metal film 71, and forming an insulating film 40 on the metal film 70 is repeated a plurality of times.

Figure 5:
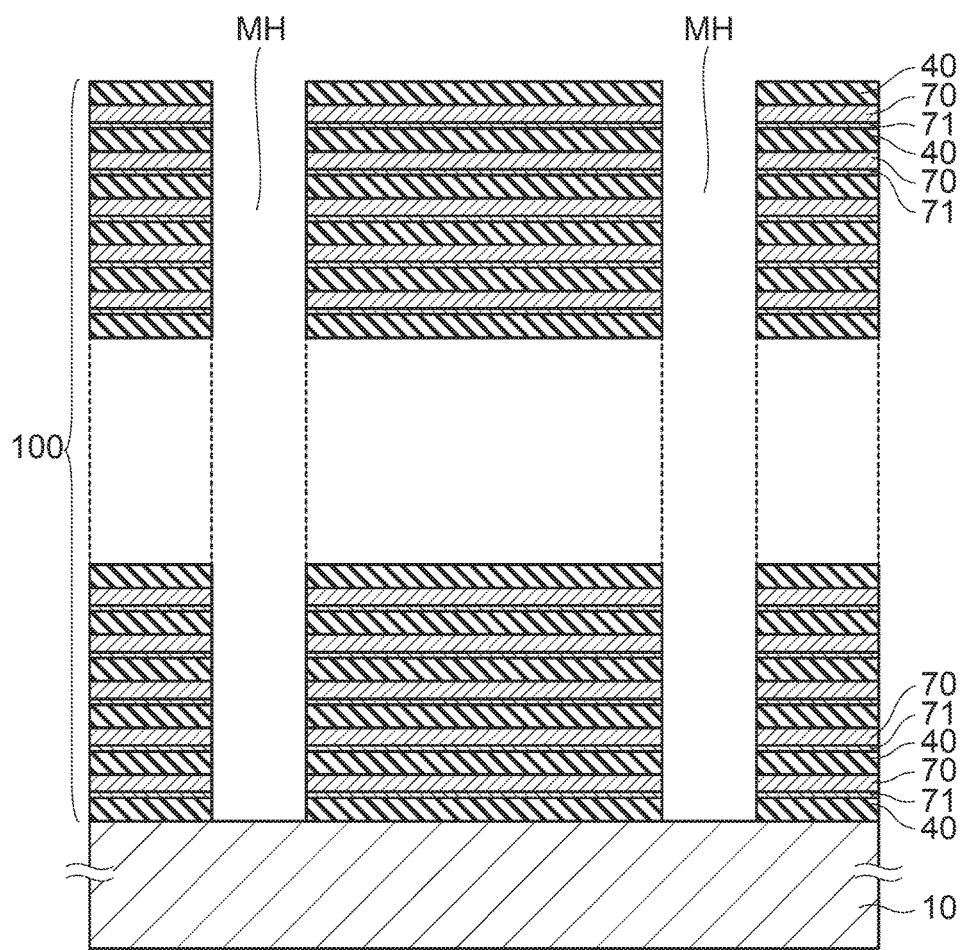

After the stacked body 100 is formed on the substrate 10, as shown in FIG. 5, a plurality of memory holes MH are formed in the stacked body 100. The memory hole MH is formed by reactive ion etching (RIE) technique using a mask layer, not shown, formed on the stacked body 100. The memory hole MH penetrates through the stacked body 100 to the substrate 10.

The films constituting the columnar part CL shown in FIG. 2 are formed in the memory hole MH. First, a memory film 30 is formed conformally on the side surface and bottom of the memory hole MH. The memory film 30 at the bottom of the memory hole MH is removed by e.g. RIE technique. Thus, the substrate 10 is exposed at the bottom of the memory hole MH. Then, a semiconductor film 20 is formed inside the memory film 30 in the memory hole MH. The lower end of the semiconductor film 20 is in contact with the substrate 10 at the bottom of the memory hole MH. After the semiconductor film 20 is formed, a core insulating film 50 is formed inside the semiconductor film 20.

A slit is formed in the portion of the stacked body 100 in which the conductive member LI is to be provided. The slit extends in the stacking direction (Z-direction) and the depth direction (X-direction) of the page in FIG. 2. Thus, the slit separates the stacked body 100 in the Y-direction.

A conductive member LI is formed in the slit via an insulating film 62. The insulating film 62 is formed conformally on the side surface and bottom of the slit. The insulating film 62 at the bottom of the slit is removed by e.g. RIE technique. Thus, the substrate 10 is exposed at the bottom of the slit. Then, the conductive member LI is formed inside the insulating film 62 in the slit. The lower end of the conductive member LI is in contact with the substrate 10.

The slit and the conductive member LI may be formed after the memory hole MH and the columnar part CL are formed. Alternatively, the memory hole MH and the columnar part CL may be formed after the slit and the conductive member LI are formed. Alternatively, the memory hole MH and the slit may be simultaneously formed by RIE technique.

After the stacked body 100, the columnar part CL, and the conductive member LI are formed, an upper interconnect of e.g. the bit lines BL and the source layer SL shown in FIG. 1 is formed on the stacked body 100.

In the following, a method for forming the underlying metal film 71 and the metal film 70 is described.

First, a method for forming the underlying metal film 71 is described.

The underlying metal film 71 is formed on the insulating film 40. As the underlying metal film 71, for instance, a TaAl film is formed by sputtering technique. In a sputtering chamber of a gas atmosphere containing argon (Ar), a Ta target and an Al target are placed on the cathode side and sputtered simultaneously.

The composition of the TaAl film is controlled by adjusting the power applied to the Ta target (cathode) and the power applied to the Al target (cathode). According to the embodiment, the application power is adjusted so that the Al content in the TaAl film is more than 50 atomic % and less than 85 atomic %.

Next, a metal film 70 primarily containing at least one of W and Mo is formed on the underlying metal film 71 by physical vapor deposition (PVD) technique, chemical vapor deposition (CVD) technique, atomic layer deposition (ALD) technique, or coating technique. The metal film 70 undergoes crystal growth on the underlying metal film 71.

For instance, a Mo film as the metal film 70 is formed by sputtering technique on the TaAl film as the underlying metal film 71.

Here, the crystal structure of Mo and W is described. Mo and W have a body-centered cubic structure.

Figures 6A, 6B:
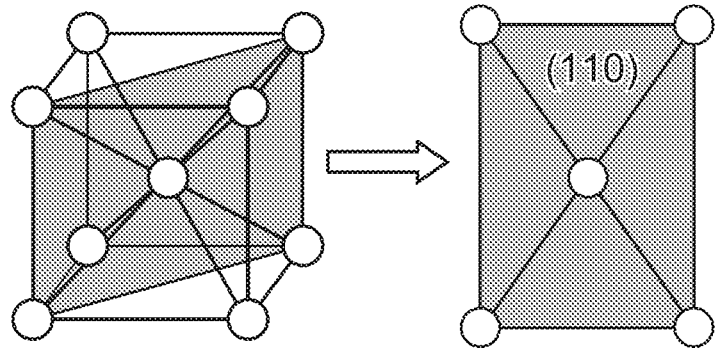
FIGS. 6A to 6F are schematic views of body-centered cubic structures and main plane orientations of the body-centered cubic structures.
Figures 6C, 6D:
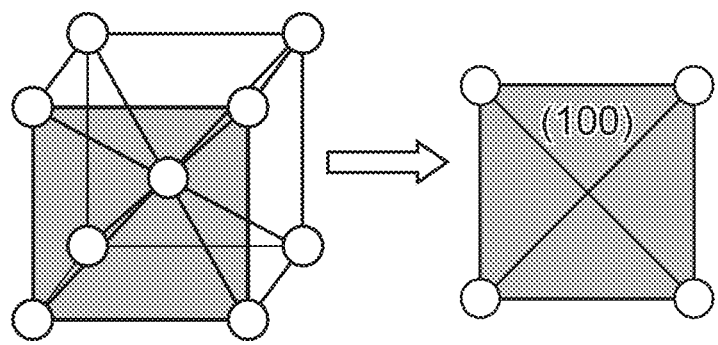
Figures 6E, 6F:
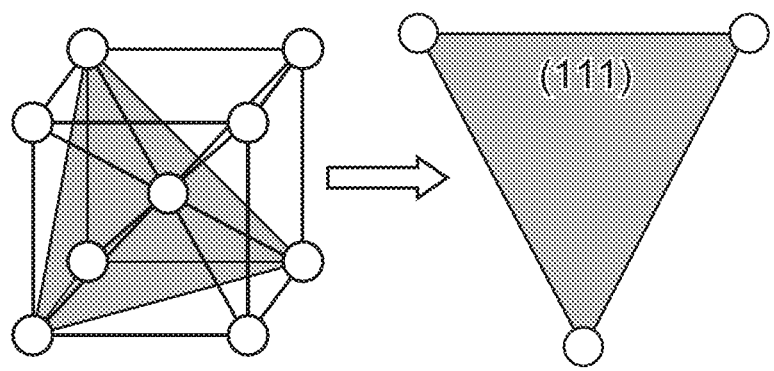

FIGS. 6A, 6C, and 6E are schematic perspective views of the body-centered cubic structure. FIGS. 6B, 6D, and 6F are schematic views showing the main plane orientation of the body-centered cubic structure.

The plane shaded in FIG. 6A is a (110) plane. FIG. 6B shows the extracted (110) plane.

The plane shaded in FIG. 6C is a (100) plane. FIG. 6D shows the extracted (100) plane.

The plane shaded in FIG. 6E is a (111) plane. FIG. 6F shows the extracted (111) plane.

When the Mo film or W film is formed on the $SiO_2$ film by sputtering technique or CVD technique, the main orientation of the plane of the Mo film or W film along the interface with the $SiO_2$ film tends to be (110), which is the close-packed plane with low surface energy. Here, the main orientation of (110) means that the diffraction intensity in the plane orientation (110) is the strongest in the diffraction measurement for the surface of the Mo film or W film, or its interface with the $SiO_2$ film.

In contrast, according to the embodiment, the Mo film (metal film 70) is formed on the TaAl film (underlying metal film 71) under composition control such that the Al content is more than 50 atomic % and less than 85 atomic %. Thus, the main orientation of the Mo film can be set to (100).

The average grain size of the crystal of such a Mo film with a main orientation of (100) is larger than the average grain size of the crystal of a Mo film with a main orientation of (110). In the body-centered cubic structure, the (100) plane has lower in-plane atomic density and higher surface energy than the (110) plane. The crystal grows so as to minimize the sum of the surface energy and the strain energy. On the other hand, the energy contributing to crystal growth is constrained by the energy at the time of film formation. That is, in the case where the Mo film is formed in the orientation of the (110) plane having low surface energy, a small amount of energy is used for crystal grain growth. Thus, the crystal grain in the formed film is likely to be small.

In contrast, in the (100) plane having higher surface energy than the (110) plane, a larger amount of energy is used for grain growth in the film than in the (110) plane. Thus, the crystal grain growth advances so as to make the strain energy lower. Accordingly, it is considered that the grain size is made larger.

The crystal grain in the formed film can be analyzed by e.g. electron back scatter diffraction pattern (EBSD) technique. More specifically, a tilted sample is irradiated with an electron beam. Then, diffraction electron beams at each crystal plane are obtained from the sample surface, and can be used to monitor the orientation of the crystal. Furthermore, the grain size of the crystal can be calculated from the spatial distribution of the crystal orientation at this time.

Figure 7A:
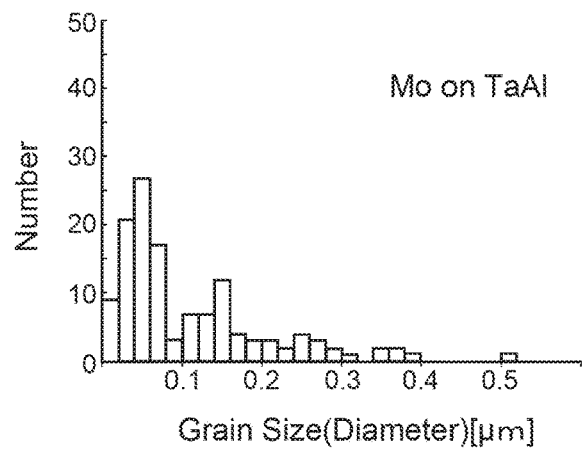
FIG. 7A is a grain size distribution diagram of a crystal of Mo film formed on TaAl film.

Here, FIG. 7A is a grain size distribution diagram of the crystal of the Mo film formed on the TaAl film with an Al content of approximately 77-82 atomic %. FIG. 7C is a grain size distribution diagram of the crystal of the Mo film formed on the $SiO_2$ film.

As the result of EBSD analysis, the Mo film formed on the TaAl film has a main orientation of (100). The Mo film formed on the $SiO_2$ film has a main orientation of (110). By comparison between FIGS. 7A and 7C, it is confirmed that the Mo film on the TaAl film includes more crystals with a larger size than the Mo film on the $SiO_2$ film.

The crystal having a larger grain size decreases the specific resistance. That is, the specific resistance of the Mo film with a main orientation of (100) is lower than the specific resistance of the Mo film with a main orientation of (110).

Figure 8A:
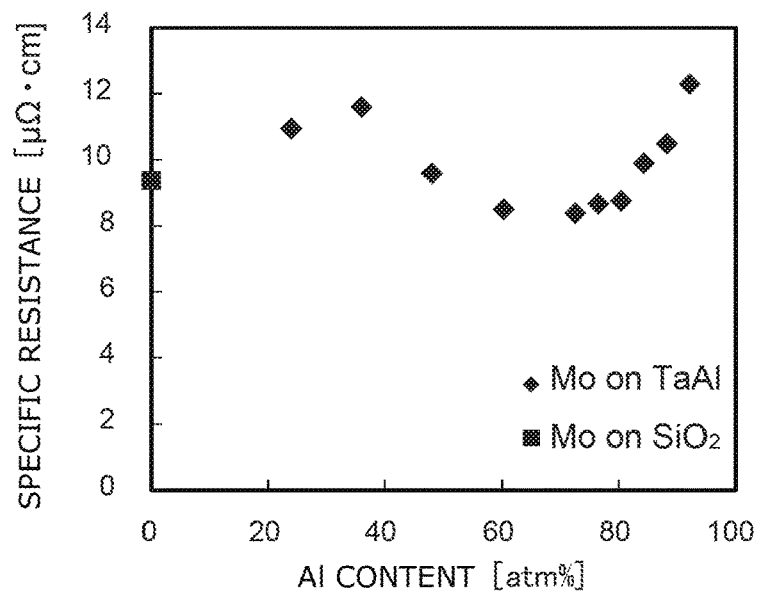
FIG. 8A is a characteristic diagram showing how a specific resistance of Mo film formed on TaAl film depends on Al content in the TaAl film.

FIG. 8A is a characteristic diagram showing how the specific resistance of the Mo film formed on the TaAl film depends on the Al content in the TaAl film. FIG. 8A also shows the specific resistance of the Mo film formed on the $SiO_2$ film (plotted on the axis at which the Al content is 0 atomic %).

From the result of FIG. 8A, it is found that the specific resistance of the Mo film on the TaAl film is lower than the specific resistance of the Mo film on the $SiO_2$ film when the Al content in the TaAl film is more than 50 atomic % and less than 85 atomic %.

Thus, it is considered that the Mo film formed on the TaAl film with an Al content of more than 50 atomic % and less than 85 atomic % has a main orientation of (100) and has a large grain size. That is, when the Mo film is formed on the TaAl film with a suitably controlled composition ratio, the specific resistance of the Mo film can be decreased.

The same also applies to tungsten having a body-centered cubic structure like molybdenum. That is, the W film formed on the TaAl film with an Al content of more than 50 atomic % and less than 85 atomic % has a main orientation of (100), has a large grain size, and has a lower specific resistance than the W film on the $SiO_2$ film.

The metal film (Mo film or W film) 70 is for a control electrode of the memory cell MC and the select transistor STD, STS. Thus, the resistance of the control electrode of the memory cell MC and the select transistor STD, STS having the metal film (Mo film or W film) 70 formed on the underlying metal film 71 made of TaAl film with an Al content of more than 50 atomic % and less than 85 atomic % can be made lower than the resistance of the control electrode of the memory cell MC and the select transistor STD, STS having the Mo film or W film formed directly on the $SiO_2$ film.

The metal film (Mo film or W film) 70 has a melting point enough to withstand e.g. annealing at approximately 1000° C. performed after forming the semiconductor film 20. The metal film 70 is not melted at the time of the annealing. Furthermore, no metal diffusion occurs.

The underlying metal film 71, including the TaAl film and the other films described below, is an amorphous or microcrystalline film at least immediately after film formation. The underlying metal film 71 may be recrystallized by annealing in the post-process. However, the recrystallized underlying metal film 71 does not include a larger crystal grain than the metal film 70. The average grain size of the underlying metal film 71 is smaller than the average grain size of the metal film 70. Furthermore, the crystal grain of the underlying metal film 71 and the crystal grain of the metal film 70 are not united into one crystal grain by annealing.

Next, an alternative example of the underlying metal film 71 is described.

As the underlying metal film 71, for instance, a WZr film is formed by sputtering technique. In a sputtering chamber of a gas atmosphere containing argon (Ar), a W target and a Zr target are placed on the cathode side and sputtered simultaneously.

The composition of the formed WZr film is controlled by adjusting the power applied to the W target (cathode) and the power applied to the Zr target (cathode). The application power is adjusted so that the Zr content in the WZr film is less than 40 atomic %.

For instance, a Mo film is formed as the metal film 70 by sputtering technique on the WZr film. The Mo film (metal film 70) is formed on the WZr film (underlying metal film 71) under composition control such that the Zr content is less than 40 atomic %. Thus, the main orientation of the Mo film can be set to (111).

The average grain size of the crystal of such a Mo film with a main orientation of (111) is larger than the average grain size of the crystal of a Mo film with a main orientation of (110). In the body-centered cubic structure, the (111) plane has lower in-plane atomic density and higher surface energy than the (110) plane. The crystal grows so as to minimize the sum of the surface energy and the strain energy under the constrained amount of available energy. Thus, in the (111) plane having higher surface energy than the (110) plane, the crystal grain growth advances so as to make the strain energy lower than in the (110) plane. Accordingly, it is considered that the grain size is made larger.

Figure 7B:
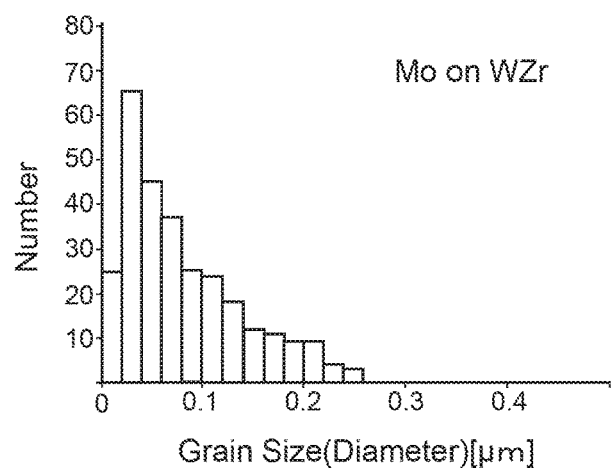
FIG. 7B is a grain size distribution diagram of a crystal of Mo film formed on WZr film.
Figure 7C:
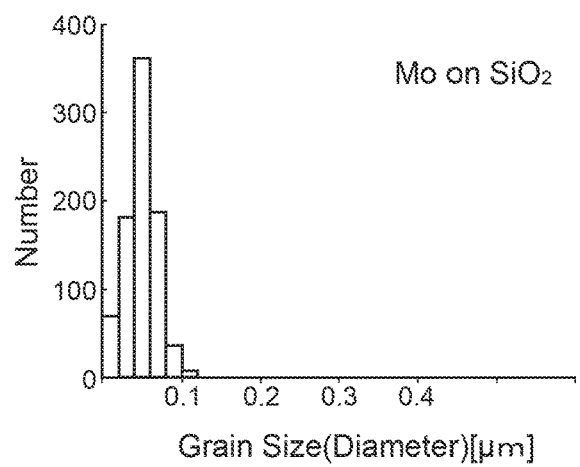
FIG. 7C is a grain size distribution diagram of a crystal of Mo film formed on $SiO_2$ film.

FIG. 7B is a grain size distribution diagram of the crystal of the Mo film formed on the WZr film with a Zr content of approximately 5-10 atomic %. As the result of EBSD analysis, the Mo film formed on the WZr film has a main orientation of (111). As described above, FIG. 7C shows a crystal grain size distribution of the Mo film on the $SiO_2$ film. By comparison between FIGS. 7B and 7C, it is confirmed that the Mo film on the WZr film includes more crystals with a larger size than the Mo film on the $SiO_2$ film.

The crystal having a larger grain size decreases the specific resistance. That is, the specific resistance of the Mo film with a main orientation of (111) is lower than the specific resistance of the Mo film with a main orientation of (110).

Figure 8B:
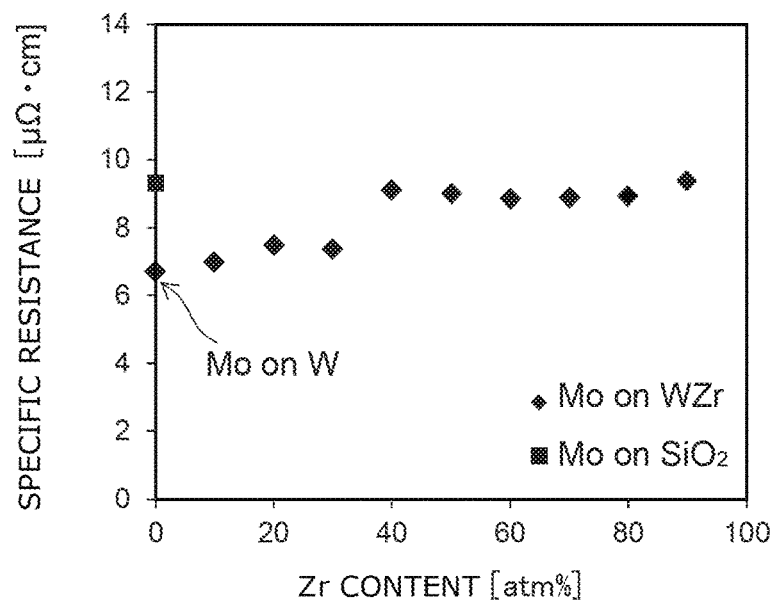
FIG. 8B is a characteristic diagram showing how a specific resistance of Mo film formed on WZr film depends on Zr content in the WZr film.

FIG. 8B is a characteristic diagram showing how the specific resistance of the Mo film formed on the WZr film depends on the Zr content in the WZr film. FIG. 8B also shows the specific resistance of the Mo film formed on the $SiO_2$ film (plotted on the axis at which the Zr content is 0 atomic %). The WZr film having a Zr content of 0 atomic % corresponds to an elemental film of tungsten.

From the result of FIG. 8B, it is found that the specific resistance of the Mo film on the WZr film is lower than the specific resistance of the Mo film on the $SiO_2$ film when the Zr content in the WZr film is less than 40 atomic %.

Thus, it is considered that the Mo film formed on the WZr film with a Zr content of less than 40 atomic % has a main orientation of (111) and has a large grain size. That is, when the Mo film is formed on the WZr film with a suitably controlled composition ratio, the specific resistance of the Mo film can be decreased.

The same also applies to tungsten having a body-centered cubic structure like molybdenum. That is, the W film formed on the WZr film with a Zr content of less than 40 atomic % has a main orientation of (111), has a large grain size, and has a lower specific resistance than the W film on the $SiO_2$ film.

Thus, the resistance of the control electrode of the memory cell MC and the select transistor STD, STS having the metal film (Mo film or W film) 70 formed on the underlying metal film 71 made of WZr film with a Zr content of less than 40 atomic % can be made lower than the resistance of the control electrode of the memory cell MC and the select transistor STD, STS having the Mo film or W film formed directly on the $SiO_2$ film.

Next, a further alternative example of the underlying metal film 71 is described.

As the underlying metal film 71, for instance, a WTi film is formed by sputtering technique. In a sputtering chamber of a gas atmosphere containing argon (Ar), a W target and a Ti target are placed on the cathode side and sputtered simultaneously.

The composition of the formed WTi film is controlled by adjusting the power applied to the W target (cathode) and the power applied to the Ti target (cathode). The application power is adjusted so that the Ti content in the WTi film is less than 80 atomic %.

For instance, a Mo film is formed as the metal film 70 by sputtering technique on the WTi film. The Mo film (metal film 70) is formed on the WTi film (underlying metal film 71) under composition control such that the Ti content is less than 80 atomic %. Thus, the main orientation of the Mo film can be set to (111).

As in the aforementioned case where the Mo film is formed on the WZr film, in the (111) plane having higher surface energy than the (110) plane, the crystal grain growth advances so as to make the strain energy lower than in the (110) plane. Accordingly, it is considered that the grain size of the Mo film formed on the WTi film is made larger.

The crystal having a larger grain size decreases the specific resistance. That is, the specific resistance of the Mo film with a main orientation of (111) is lower than the specific resistance of the Mo film with a main orientation of (110).

Figure 9:
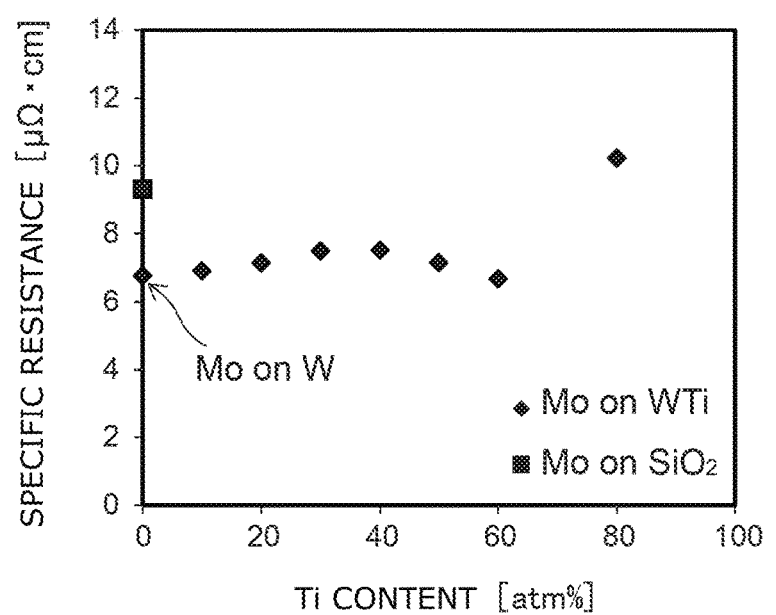
FIG. 9 is a characteristic diagram showing how a specific resistance of Mo film formed on WTi film depends on Ti content in the WTi film.

FIG. 9 is a characteristic diagram showing how the specific resistance of the Mo film formed on the WTi film depends on the Ti content in the WTi film. FIG. 9 also shows the specific resistance of the Mo film formed on the $SiO_2$ film (plotted on the axis at which the Ti content is 0 atomic %). The WTi film having a Ti content of 0 atomic % corresponds to an elemental film of tungsten.

From the result of FIG. 9, it is found that the specific resistance of the Mo film on the WTi film is lower than the specific resistance of the Mo film on the $SiO_2$ film when the Ti content in the WTi film is less than 80 atomic %.

Thus, it is considered that the Mo film formed on the WTi film with a Ti content of less than 80 atomic % has a main orientation of (111) and has a large grain size. That is, when the Mo film is formed on the WTi film with a suitably controlled composition ratio, the specific resistance of the Mo film can be decreased.

The same also applies to tungsten having a body-centered cubic structure like molybdenum. That is, the W film formed on the WTi film with a Ti content of less than 80 atomic % has a main orientation of (111), has a large grain size, and has a lower specific resistance than the W film on the $SiO_2$ film.

Thus, the resistance of the control electrode of the memory cell MC and the select transistor STD, STS having the metal film (Mo film or W film) 70 formed on the underlying metal film 71 made of WTi film with a Ti content of less than 80 atomic % can be made lower than the resistance of the control electrode of the memory cell MC and the select transistor STD, STS having the Mo film or W film formed directly on the $SiO_2$ film.

Next, a further alternative example of the underlying metal film 71 is described.

As the underlying metal film 71, an elemental film of tungsten (W film) is formed by sputtering technique. In a sputtering chamber of a gas atmosphere containing argon (Ar), a W target is placed on the cathode side and sputtered.

For instance, a Mo film is formed as the metal film 70 by sputtering technique on the W film as the underlying metal film 71. Thus, the Mo film (metal film 70) is formed on the W film (underlying metal film 71). Accordingly, the main orientation of the Mo film can be set to (111).

As described above, in the (111) plane having higher surface energy than the (110) plane, the crystal grain growth advances so as to make the strain energy lower than in the (110) plane. Accordingly, it is considered that the grain size of the Mo film formed on the W film is made larger.

The crystal having a larger grain size decreases the specific resistance. That is, the specific resistance of the Mo film with a main orientation of (111) is lower than the specific resistance of the Mo film with a main orientation of (110).

FIGS. 8B and 9 show the specific resistance of the Mo film on the W film. The specific resistance of the Mo film on the W film is lower than the specific resistance of the Mo film on the $SiO_2$ film plotted on the same FIGS. 8B and 9.

Thus, it is considered that the Mo film formed on the W film has a main orientation of (111) and has a large grain size. That is, when the Mo film is formed on the W film, the specific resistance of the Mo film can be decreased.

The same also applies to tungsten having a body-centered cubic structure like molybdenum. That is, the W film as the metal film 70 formed on the W film as the underlying metal film 71 has a main orientation of (111), has a large grain size, and has a lower specific resistance than the W film on the SiO$_2$ film.

Here, the W film as the metal film 70 has a thickness enough to function as a control electrode of e.g. the memory cell MC, and has a large grain size. In contrast, the W film as the underlying metal film 71 is thinner than the metal film 70, and is an amorphous film, or a microcrystalline film having a smaller grain size than the metal film 70.

The resistance of the control electrode of the memory cell MC and the select transistor STD, STS having the metal film (Mo film or W film) 70 formed on the underlying metal film 71 made of W film can be made lower than the resistance of the control electrode of the memory cell MC and the select transistor STD, STS having the Mo film or W film formed directly on the SiO$_2$ film.

It is noted that a W film was formed as the metal film 70 by sputtering technique on the W film as the underlying metal film 71 formed by CVD technique, then the main orientation of the metal film (W film) 70 was (110).

The process for forming a W film as the underlying metal film 71 by CVD technique alternately performs e.g. the step of supplying a gas containing WF$_6$, and the step of supplying a gas containing a hydrogen compound such as SiH$_4$ and B$_2$H$_6$. In this case, the formed W film is mixed with impurity originating from the source gas such as B and F.

The W film with a large amount of impurity may have a low surface energy due to coupling between the impurity and W. The surface energy of the metal film 70 is denoted by $\gamma f$. The surface energy of the underlying metal film 71 is denoted by $\gamma s$. The interfacial energy of the underlying metal film 71 and the metal film 70 is denoted by $\gamma i$. Then, the relation of $\gamma f \leq \gamma s - \gamma i$ holds among them.

From this relation, it is considered that the metal film (Mo film or W film) is less likely to assume a main orientation of (111) having high surface energy when the surface energy $\gamma s$ of the underlying metal film 71 is low. Here, the metal film (Mo film or W film) formed on the W film formed by CVD technique can have a main orientation of (111) if the composition of the films can be suitably controlled.

On the other hand, the sputtering technique enables formation of a W film as the underlying metal film 71 having high purity close to the target composition. Thus, the metal film (Mo film or W film) 70 formed on the W film as the underlying metal film 71 formed by sputtering technique can assume a main orientation of (111) having high surface energy. Thus, the specific resistance can be decreased by a larger grain size.

In the case of forming a metal film (Mo film or W film) 70 by sputtering technique, the sputtering film formation performed simultaneously with heating the substrate 10 side facilitates migration of metal atoms and facilitates increasing the crystal grain size.

Furthermore, the DC power applied to the target (cathode) is decreased to e.g. 0.5 W/cm$^2$ or less. This decreases the deposition rate of the film. Thus, film formation can be performed in a state closer to the thermal equilibrium state. This also facilitates increasing the crystal grain size.

Preferably, the underlying metal film 71 and the metal film 70 are formed continuously in a vacuum atmosphere (reduced-pressure atmosphere) without exposure to the ambient air. The continuous film formation of the underlying metal film 71 and the metal film 70 in a vacuum atmosphere suppresses the decrease of surface energy due to oxidation of the underlying metal film 71. According to the aforementioned relation of $\gamma f \leq \gamma - \gamma i$, the metal film (Mo film or W film) is more likely to assume a main orientation of (111), (100) having high surface energy when the surface energy $\gamma s$ of the underlying metal film 71 is high.

The underlying metal film 71 may contain W, and the metal film 70 may be a W film. In this case, the underlying metal film 71 and the metal film 70 can be formed continuously without opening to the ambient air by using the same W target in the same sputtering chamber. Alternatively, the underlying metal film 71 may be a WZr film or WTi film. In this case, at the time of sputtering film formation of the metal film (W film) 70, no power is applied to the target of the compositional element (Zr or Ti) other than W in the underlying metal film 71.

Alternatively, sputtering film formation of the underlying metal film 71 may be performed in a first chamber. Then, the wafer may be transported to a second chamber through a space of reduced-pressure atmosphere not opened to the ambient air. Thus, sputtering film formation of the metal film 70 may be performed in the second chamber.

In the example described in the above embodiment, the interface of the underlying metal film 71 and the metal film 70 is generally parallel to the major surface of the substrate 10, or lies along the major surface of the substrate 10. However, the embodiment is not limited thereto. The interface of the underlying metal film 71 and the metal film 70 may be perpendicular or oblique to the major surface of the substrate 10. Also in this case, the metal film 70 can be formed on the aforementioned underlying metal film 71. Thus, the main orientation of the plane of the metal film 70 along the interface with the underlying metal film 71 can be set to (100) or (111). Accordingly, the specific resistance of the metal film 70 can be reduced.

The underlying metal film 71 and the metal film 70 are not limited to the shape spread like a layer or plane, but may be shaped in a line pattern.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A stacked semiconductor memory device comprising:
    a stacked body comprising:
        a plurality of underlying metal films comprising:
            a tantalum-aluminum film having an aluminum content of more than 50 atomic % and less than 85 atomic %,
            a tungsten-zirconium film having a zirconium content of less than 40 atomic %, a tungsten-titanium film having a titanium content of less than 80 atomic %, or
            a tungsten film;
        a plurality of metal films provided on the underlying metal films and in contact with the underlying metal films, the metal films containing at least one of tungsten and molybdenum, and having a main orientation of (100) or (111); and
        a plurality of insulator films,
    wherein the underlying metal films are provided between a lower surface of the metal films and the insulator films, and the underlying metal films are not provided on an upper surface of the metal-films, and at least one of the plurality of insulator films contacts at least one of the plurality of underlying metal films and at least one the plurality of metal films.

2. The device according to claim 1, wherein the plurality of underlying metal films are amorphous.

3. The device according to claim 1, wherein an average grain size of the plurality of underlying metal films is smaller than an average grain size of the plurality of metal films.

4. The device according to claim 1, wherein the plurality of underlying metal films are thinner than the plurality of metal films.

5. The device according to claim 1, further comprising:
a semiconductor film extending in the stacked body in a stacking direction of the stacked body; and
a charge storage film provided between the semiconductor film and at least one of the plurality of metal films.

6. The device according to claim 1, wherein the plurality of underlying metal films are not connected in a stacking direction of the stacked body, and the plurality of underlying metal films are separated from each other in the stacking direction.

7. The device according to claim 1, wherein the plurality of underlying metal films, the plurality of metal films, and the plurality of insulator films are stacked above a major surface of a substrate in a direction perpendicular to the major surface.

8. A method for manufacturing a stacked semiconductor memory device, comprising:
forming a stacked body comprising a plurality of insulator films, a plurality of amorphous or microcrystalline metal films, and plurality metal films by:
forming an amorphous or microcrystalline metal film on an insulator film, the amorphous or microcrystalline metal film contacting the insulator film, the amorphous or microcrystalline metal film being a tantalum-aluminum film having an aluminum content of more than 50 atomic % and less than 85 atomic %, a tungsten-zirconium film having a zirconium content of less than 40 atomic %, a tungsten-titanium film having a titanium content of less than 80 atomic %, or a tungsten film;
performing crystal growth of a metal film on the amorphous or microcrystalline metal film, the metal film containing at least one of tungsten and molybdenum and having a main orientation of (100) or (111); and
repeating the forming of the amorphous or microcrystalline metal film on the insulator film and the performing of crystal growth of the metal film on the amorphous or microcrystalline metal film a plurality of times,
wherein
the plurality of amorphous or microcrystalline metal films are formed between a lower surface of at least one of the plurality of metal films and at least on of the plurality of insulator films, and
the plurality of amorphous or microcrystalline metal films are not provided on an upper surface of the plurality of metal films.

9. The method according to claim 8, wherein the tantalum-aluminum film is formed as the amorphous or microcrystalline metal film by sputtering technique using a tantalum target and an aluminum target.

10. The method according to claim 8, wherein the tungsten-zirconium film is formed as the amorphous or microcrystalline metal film by sputtering technique using a tungsten target and a zirconium target.

11. The method according to claim 8, wherein the tungsten-titanium film is formed as the amorphous or microcrystalline metal film by sputtering technique using a tungsten target and a titanium target.

12. The method according to claim 8, wherein the metal film is formed on the amorphous or microcrystalline metal film by sputtering technique.

13. The method according to claim 12, wherein DC power applied to a target is set to 0.5 W/cm$^2$ or less when the metal film is formed by sputtering technique.

14. The method according to claim 12, wherein the metal film is formed by sputtering technique on the amorphous or microcrystalline metal film above a heated substrate.

15. The method according to claim 8, wherein the amorphous or microcrystalline metal film and the metal film are formed continuously in a vacuum atmosphere.

16. The method according to claim 12, further comprising:
forming a hole in the stacked body, the hole extending in a stacking direction of the stacked body;
forming a film including a charge storage film on a side surface of the hole; and
forming a semiconductor film on a side surface of the film including the charge storage film.

17. A stacked semiconductor memory device comprising:
a stacked body comprising:
a plurality of underlying metal films comprising:
a tantalum-aluminum film having an aluminum content of more than 50 atomic % and less than 85 atomic %,
a tungsten-zirconium film having a zirconium content of less than 40 atomic %, a tungsten-titanium film having a titanium content of less than 80 atomic %, or
a tungsten film; and
a plurality of metal films provided on the underlying metal films and in contact with the underlying metal films, the metal films containing at least one of tungsten and molybdenum, and having a main orientation of (100); and
a plurality of insulator films,
wherein
the underlying metal films are provided between a lower surface of the metal films and the insulator films, and the underlying metal films are not provided on an upper surface of the metal films.

* * * * *